US008668963B2

(12) United States Patent
Bedel et al.

(10) Patent No.: US 8,668,963 B2
(45) Date of Patent: Mar. 11, 2014

(54) METHOD FOR DIFFUSING METAL PARTICLES WITHIN A COMPOSITE LAYER

(71) Applicants: Commissariat a l'Energie Atomique et aux Energies Alternatives, Paris (FR); Centre National de la Recherche Scientifique, Paris (FR)

(72) Inventors: Laurent Bedel, Quaix en Chartreuse (FR); Cyril Cayron, Grenoble (FR); Michel Jouve, Moirans (FR); Francis Maury, Labege (FR); Etienne Quesnel, Meylan (FR)

(73) Assignees: Commissariat a l'Energie Atomique et aux Energies Alternatives, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 13/684,686

(22) Filed: Nov. 26, 2012

(65) Prior Publication Data

US 2013/0084410 A1   Apr. 4, 2013

Related U.S. Application Data

(63) Continuation of application No. PCT/KR2011/051145, filed on May 19, 2011.

(30) Foreign Application Priority Data

Jun. 2, 2010   (FR) ...................................... 10 54311

(51) Int. Cl.
  *H05H 1/24*   (2006.01)
(52) U.S. Cl.
  USPC .................... 427/576; 427/255.31; 427/376.2
(58) Field of Classification Search
  USPC .................................. 427/255.31, 376.2, 576
  See application file for complete search history.

(56) References Cited

U.S. PATENT DOCUMENTS

| | | | | |
|---|---|---|---|---|
| 5,125,358 | A * | 6/1992 | Ueda et al. ............. | 118/723 MR |
| 6,706,319 | B2 * | 3/2004 | Seth et al. ..................... | 427/190 |
| 2007/0154634 | A1 * | 7/2007 | Renn ............................. | 427/180 |
| 2009/0142584 | A1 | 6/2009 | Bedel et al. | |
| 2010/0167540 | A1 * | 7/2010 | Sakuma et al. ............... | 438/676 |

FOREIGN PATENT DOCUMENTS

| | | | |
|---|---|---|---|
| FR | 2 924 359 | | 6/2009 |
| WO | WO 2007/091682 | * | 8/2007 |

OTHER PUBLICATIONS

Gai, P.L., et al., "Bulk diffusion of metal particles on ceramic substrates". Nature, vol. 348, Nov. 29, 1990, pp. 430-432.*
Heemeier, M., et al., "On the thermal stability of metal particles supported on a thin alumina film". Surface Science 523 (2003) 103-110.*
Xu, Chen, et al., "Local electronic structure of metal particles on metal oxide surfaces: Ni on alumina". Faraday Discuss., 1996, 105, 247-261.*
Christov, N. N., "Charged-particle diffusion in plasma with negative diffusion coefficient and plasma self-constriction." Europhysics Letters, Dec. 20, 1996, 36 (9), pp. 687-689 (1996).*
Pivin et al., "*Competing Processes of Clustering and Mixing of Noble Metal Films Embedded in Silica Under Ion Irradiation*," Thin Solid Films, vol. 366, 2000, pp. 284-293.
Tseng et al., "*Microstructural Analysis and Mechanical Properties of TaN-Ag nanocomposite Thin Films*," Thin Solid Films, vol. 517, 2009, Abstract.
Sangpour et al., "*The Effect of Au/Ag ratios on Surface Composition and Optical Properties of Co-sputtered Alloy Nanoparticles in Au-Ag:SiO$_2$ Thin Films*," Journal of Alloys and Compounds, vol. 486, 2009, Abstract.
Wang et al., "*Photodiffusion of Silver in Germanium-Sulfur Compounds Studied by AFM, Nanoindentation and RBS Methods*," Physical Chemistry Chemical Physics, vol. 5, 2003, Abstract.
Yliniemi et al., "*Chemical Composition and Barrier Properties of Ag Nanoparticle-Containing Sol-gel Films In Oxidizing and Reducing Low-Temperature Plasmas*," Surface and Coatings Technology 201, 2007, pp. 7865-7872.
Armelao et al., "*Recent Trends on Nanocomposites Based on Cu, Ag and Au Clusters: A Closer Look*," Coordination Chemistry Reviews, Elsevier Science, vol. 250, 2006, pp. 1294-1314.
Garcia et al., "*Photoluminescence of Silver in Glassy Matrices*," Journal of Applied Physics, vol. 96, No. 7, 2004, pp. 3737-3741.
Torrell et al., "*Functional and Optical Properties of Au:TiO$_2$ Nanocomposite Films: The Influence of Thermal Annealing*," Applied Surface Science 256, 2010, pp. 6536-6542.
Ovchinnikov et al., "*Surface Plasmon Resonances in Diffusive Reflection Spectra of Multilayered Silver Nanocomposite Films*," Second International Conference on Quantum, Nano and Micro Technologies, 2008, pp. 40-44.

* cited by examiner

*Primary Examiner* — Bret Chen
(74) *Attorney, Agent, or Firm* — Burr & Brown, PLLC

(57) ABSTRACT

A method for diffusing metal particles including a composite layer deposited on a substrate, with the composite layer further including at least one dielectric matrix, and where the diffusion of the metal particles towards the substrate is achieved by means of a plasma treatment.

16 Claims, 4 Drawing Sheets

METHOD FOR DIFFUSING METAL PARTICLES WITHIN A COMPOSITE LAYER

BACKGROUND OF THE INVENTION

1 Field of the Invention

The present invention relates to a method for diffusing metal particles in a composite layer comprising a dielectric matrix and said metal particles.

The fields of application of the present invention especially comprise microelectronics, photovoltaics, optics, catalysis, sensors.

2 Description of Related Art

Thin layers, or matrixes, comprising metal particles and especially metal nanoparticles, have characteristics specific to their structure and composition. According to cases, the composite layers may thus have electric, catalytic, optical, or magnetic properties, for example.

In order to envisage various applications, especially in the above-mentioned fields, a control of the structure of the thin layers comprising metal particles is important to anticipate the final properties. For example, composite layers may have a surface plasmon resonance effect reinforcing the absorption of light and thus influencing the efficiency of a photovoltaic cell. The characteristics of the composite layer thus obviously need to be controlled.

Such composite layers may be obtained by a method of composite deposition on a substrate. The deposition is generally performed according to techniques known by those skilled in the art, that is, wet (impregnation, sol-gel) or dry (PVD, CVD) processes.

PVD is a physical vapor deposition by evaporation in vacuum while CVD is a chemical vapor deposition.

The composite layers thus obtained may have a homogeneous or multilayered structure, according to the preparation mode used.

When the matrix and the metal particles are deposited simultaneously, the particles are embedded in the matrix, a small ratio of said particles appearing at the matrix surface. Such a deposition is homogeneous, especially across the thickness of the thin film or layer.

However, when the deposition is performed in several distinct successive steps, a multilayered architecture is obtained. In such an architecture, also called "sandwich" structure, the matrix deposition and the metal particle deposition are performed sequentially. Thus, the metal particles may be isolated within the matrix if the final layer is a matrix deposition.

Although these two methods remain quite distinct from each other and the depositions thus obtained each have their own characteristics, the metal particles may evolve in both cases. They may change size and shape and diffuse during the forming process. The control of the structure of the composite layer and thus of its properties thus becomes very random, especially in terms of repeatability.

It is established that an after-treatment of composite layers enables to modify or to control the particle shape, size, and distribution. It thus becomes possible to control the final characteristics and properties of composite layers.

Prior art comprises several solutions implementing an after-treatment. Pivin et al. have shown that the shape and the size of metal nanoparticles can be modified by ion irradiation ("*Competing processes of clustering and mixing of noble metal film embedded in silica under ion irradiation*", J. C. Pivin, G. Rizza, Thin Solid Films, Vol. 366, pp. 284-293, 2000).

Teeng et al. have described the preparation of a nanocomposite layer TaN—Ag by co-sputtering. The growth of silver nanoparticles is controlled by an annealing ("Rapid Thermal Annealing") ("*Microstructural analysis and mechanical properties of TaN—Ag nanocomposite*", C. C. Tseng, J. H. Hsieh, S. C. Jang, Y. Y. Chang, W. Wu, Thin Solid Films, Vol. 517, pp. 4970-4974, 2009).

The optical absorption of surface plasmons after annealing between 400 and 800° C. of composite $SiO_2$—Ag—Au films deposited by co-sputtering has been studied by Sangpour et al. ("*The effect of Au/Ag ratios on surface composition and optical properties of co-sputtered alloy nanoparticles in Au—Ag—$SiO_2$ thin film*", P. Sangpour, O. Akhavan, A, Z. Moshfegh, Journal of Alloys and Compounds, Vol. 486, pp. 22-28, 2009). It has been observed that the annealing causes the diffusion of metal elements, the forming of metal nanoparticles being detected by optical absorption.

Besides, Wang et al. Have described the photodiffusion of silver particles deposited on GeS under a Xe lamp ("*Photodiffusion of silver in germanium-sulfur compounds studied by AFM, nanoindentation and RBS methods*", R. Wang, J. H. Horton, Physical Chemistry Chemical Physics, Vol. 5, pp.4335-4342, 2003). However, this document does not mention the presence of nanoparticles.

The present invention especially relates to a method of diffusion of metal particles in a composite layer, at ambient temperature and at decreased pressure, enabling to control the structure of the composite layer formed by the metal particles and a dielectric matrix.

SUMMARY OF THE INVENTION

The Applicant has developed a method enabling to diffuse metal particles, wherein the composite layer previously deposited on a substrate is submitted to an after-treatment. The after-treatment step enables to control the diffusion of metal particles.

Term "diffusion" is used to designate any mechanism of transport of at least one metal species in a matrix or towards the substrate.

More specifically, the present invention relates to a method for diffusing metal particles comprised in a composite layer previously deposited on a substrate, said composite layer further comprising at least one dielectric matrix, wherein the diffusion of said metal particles towards said substrate is achieved by means of a plasma treatment.

In other words, the invention especially comprises using a plasma in the vicinity of a substrate covered with at least one matrix/metal particle deposition to control the diffusion of metal particles within the matrix or towards the substrate. The method according to the invention thus enables to control the intensity of the optical absorption due to the surface plasmon resonance of metal particles.

The invention thus mainly aims at the use of a plasma in the vicinity of a substrate comprising a composite layer to diffuse the metal particles from the composite layer towards the substrate.

The substrate is generally used as a barrier layer against diffusion.

As already indicated, the composite layer may be prepared:
by simultaneous deposition of the metal particles and of the dielectric matrix, or
by sequential depositions of at least one dielectric matrix and of the metal particles.

In the first case, the matrix and the metal particles are deposited simultaneously so that the particles are embedded in the dielectric matrix, with a small ratio of particles appearing at the matrix surface. Such a deposition is homogeneous, especially across the thickness of the thin film or layer.

When the composite layer is prepared by sequential depositions of the dielectric matrix and of the metal particles, the deposition is performed in several distinct successive steps. A multilayered architecture, also called sandwich structure, is thus obtained. The metal particles may be isolated within the matrix if the final layer results from a dielectric matrix deposition.

Advantageously, the plasma treatment is performed by means of a plasma called cold plasma, and more advantageously still under the effect of a cold plasma close to or at ambient temperature. It is also necessary that no chemical precursor, which, by nature, may decompose, be introduced into the plasma.

Generally, the plasma treatment is advantageously carried out between 15° C. and 45° C. Thus, the method according to the invention has the advantage of being applicable to substrates of various natures and especially to heat-sensitive substrates.

Typically, the plasma used in the metal particle diffusion method according to the present invention contains at least one gas, which is preferentially selected from the group comprising helium, argon, xenon, or a mixture of these gases.

Of course, the temperature and pressure conditions, as well as the nature of the gases forming the plasma, are adapted according to cases. For example, those skilled in the art may easily adjust the pressure according to the gas used. In the case of helium, the reactor pressure typically is on the order of 26 Pa.

In a very specific embodiment, the plasma treatment may be performed:
  in a PECVD reactor,
  with helium,
  with a frequency ranging between 0 and 2.45 GHz, preferably between 10 kHz and 450 kHz,
  for a time period ranging between 1 second and 60 minutes, advantageously between 15 seconds and 15 minutes,
  with a power applied to the cathode ranging between 0.01 W/cm$^2$ and 10 W/cm$^2$, and in particular between 0.01 W/cm$^2$ and 1 W/cm$^2$,
  at a temperature ranging between 15 and 45° C.

Advantageously, the plasma may be generated by a DC, low-frequency, RF, MW, or ECR power supply.

Generally, the composite layer is formed according to techniques known by those skilled in the art, either by wet (impregnation, sol-gel) or dry (PVD, CVD) processes, and more advantageously by PVD.

It will only be specified that PVD is a vacuum evaporation deposition while CVD is a chemical vapor deposition.

The simultaneous deposition of the matrix and of the metal particles provides a homogeneous composite layer, while depositions in distinct successive steps of the matrix and of the metal particles provide a sandwich structure.

The dielectric matrix advantageously is a dielectric oxide, and more advantageously still silicon oxide $SiO_x$.

As already indicated, the composite layer deposited on the substrate before the plasma treatment is mainly formed of a matrix in the form of a thin layer, and of metal particles. The substrate is typically made of glass, silicon, or polymer.

On the other hand, the metal particles advantageously are particles of a metal selected from the group comprising silver, copper, gold, titanium, chromium, tantalum, or a mixture of these metals. Metal particles preferentially appear in the form of nanoparticles having their largest dimension smaller than 100 nm.

Generally, the largest dimension of the metal particles is smaller than 1 micrometer, preferably smaller than 100 nm.

The present invention also relates to the use of a plasma in the vicinity of a substrate having a composite layer integrating metal particles previously deposited thereon to achieve the diffusion of said metal particles towards the substrate.

As already indicated, the composite layer is formed either of a dielectric matrix having the metal particles dispersed inside of it, or of a dielectric matrix having the metal particles deposited on top of it.

The method according to the invention has the advantages of having a low cost and of being feasible at ambient temperature. It enables to control the surface plasmon effect according to the time of exposure to the helium plasma.

It further enables to modulate the functional properties of the composite layer by controlling the metal particle diffusion towards the substrate.

DESCRIPTION OF THE DRAWINGS

The foregoing and other features and advantages of the present invention will be discussed in the following non-limiting description of the following embodiments in connection with the accompanying drawings, among which.

EXAMPLES OF EMBODIMENT

The samples of examples 1 to 3 are prepared at ambient temperature.

PECVD stands for plasma-enhanced chemical vapor deposition.

Example 1

Figure 1:
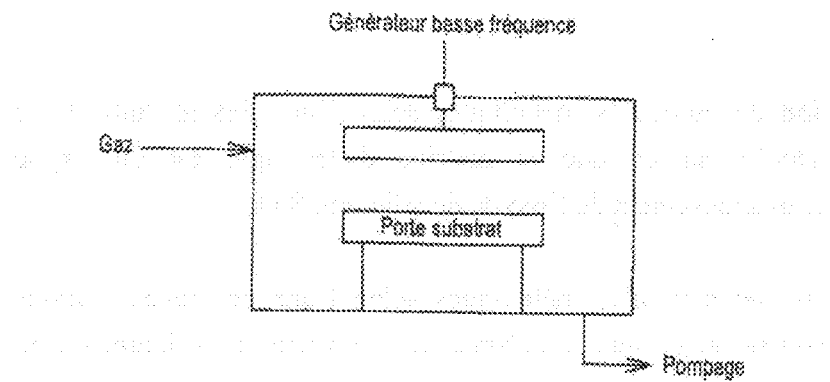
FIG. 1 shows a schematic diagram of the plasma after-treatment reactor.
Figure 2:
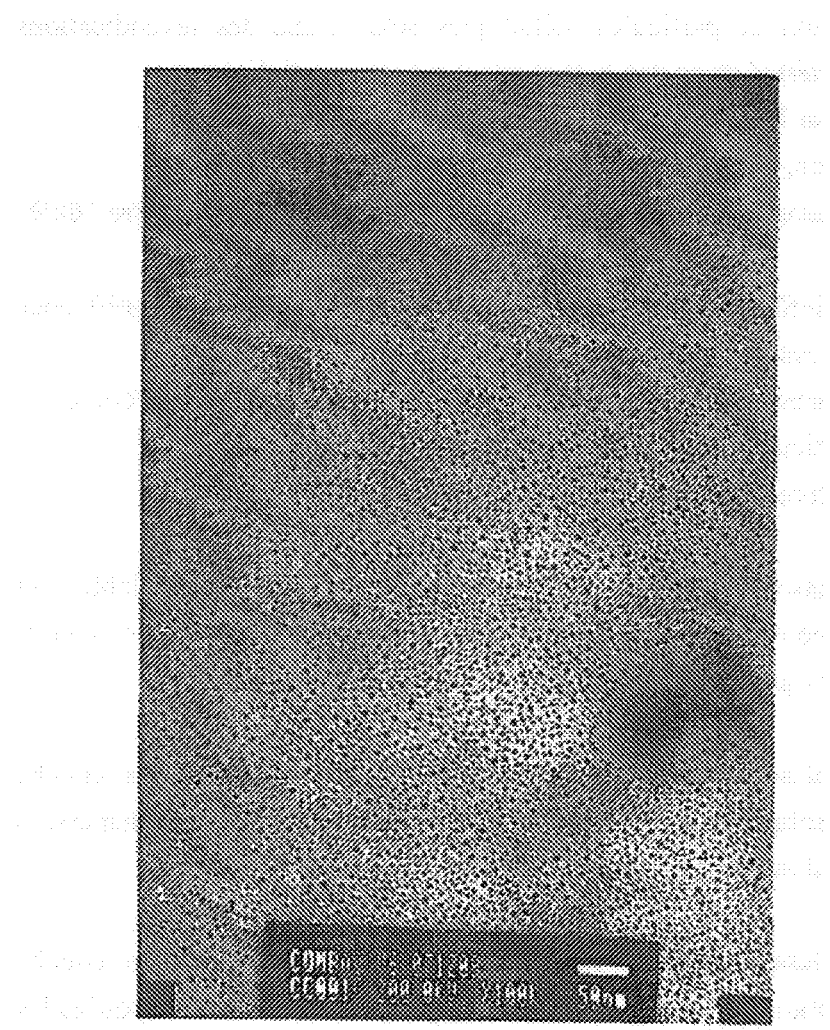
FIG. 2 illustrates a $SiO_x$—Ag—$SiO_x$ deposition on a TEM (transmission electron microscopy) grid.
Figure 3:
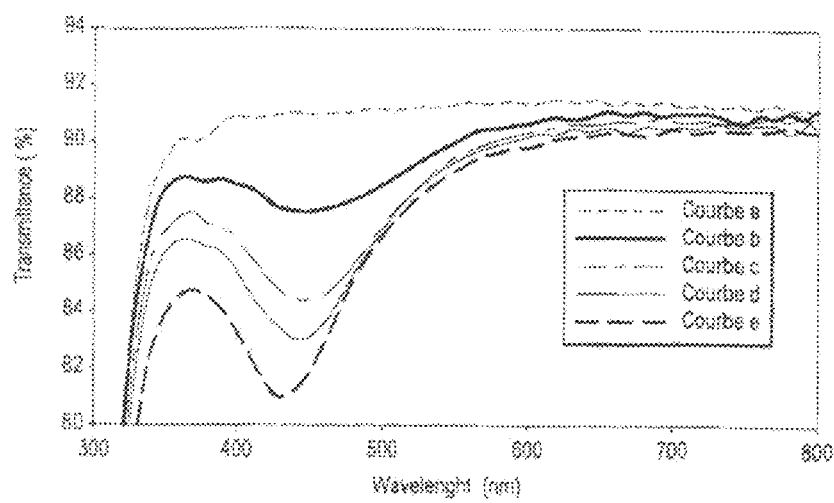
FIG. 3 shows the transmission-vs.-wavelength curves obtained for a glass substrate coated with a sandwich $SiO_x$—Ag—$SiO_x$ deposition before and after the after-treatment with a He plasma; curve (a) illustrates the deposition before the after-treatment while curves (b) to (e) illustrate the deposition after an after-treatment of 30 seconds, 2 minutes, 5 minutes, and 10 minutes, respectively.
Figure 4:
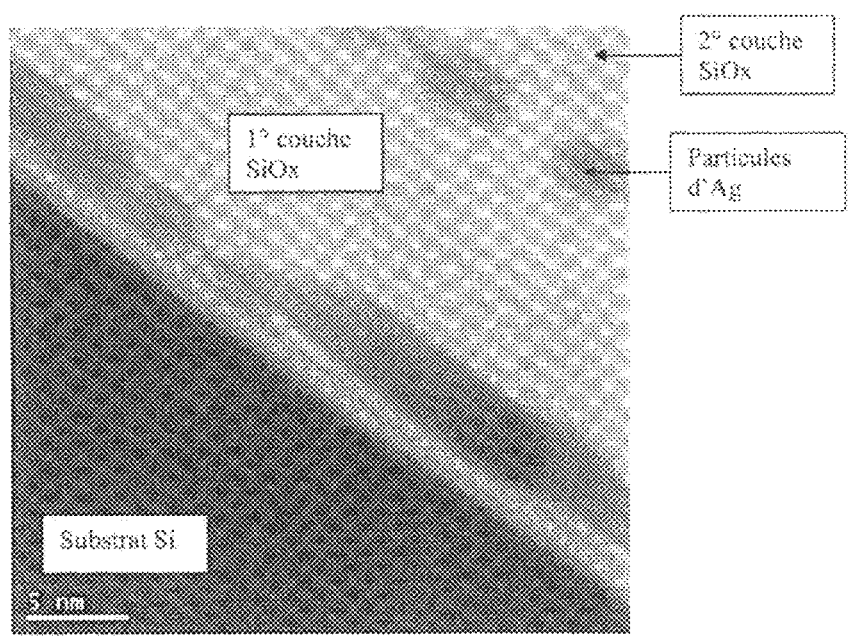
FIG. 4 shows a cross-section view of the $SiO_x$—Ag—$SiO_x$ deposition on a TEM grid. This drawing illustrates the accumulation of silver particles at the SiOx-silica interface of the substrate after the plasma treatment.

This example is illustrated by FIGS. 2 to 4.

A composite $SiO_x$—Ag—$SiO_x$ layer is deposited on a soda-lime glass substrate, a silicon substrate, and on a grid for a TEM observation.

This deposition is carried out in three steps, comprising:
  the deposition of a first $SiO_x$ layer by low-frequency PECVD; the glass, TEM, or Si sample is deposited on a grounded substrate holder; an aluminum cathode is positioned at a 3.5-cm distance from the substrate; a He and HMDSO, hexamethyldisiloxane (1%), gas mixture is introduced into the reactor, the pressure is regulated to 26 Pa; the power applied to the cathode is 2 W.cm$^{-2}$ with a 40-kHz frequency for 10 seconds; the reactive gas phase is decomposed by the plasma; the thickness of the deposition, noted SiO$_x$, is approximately 30 nanometers.

the deposition of silver nanoparticles according to prior art techniques (FR 2924359); the sample is then placed in a magnetron cathode sputtering reactor at a 3-cm distance from the silver target; argon is introduced into the reactor and the working pressure is set to 26 Pa; the generator used to sputter the silver target is a pulsed current generator (100 kHz) with a 1-W.cm$^{-2}$ power density. The deposition time is 7 seconds.

the deposition of a second SiO$_x$ layer carried out identically to the deposition of the first SiO$_x$ layer.

Characteristics of the obtained film:

The composite film or layer thus obtained has a sandwich SiO$_x$-silver nanoparticle-SiO$_x$ architecture. Such a sandwich deposition has been performed on a copper TEM grid covered with a carbon film. The observation by TEM of the sandwich film reveals the presence of silver nanoparticles having a diameter of approximately 3 nanometers.

The transmittance of the film deposited on soda-lime glass is determined by an optical spectrometer measurement between 300 and 800 nanometers. The transmission curve (FIG. 3, curve (a)) is identical to that conventionally observed for a soda-lime plate with a high absorption below 400 nanometers, which is due to the actual glass. The transmittance beyond 400 nanometers is approximately 91%. There is no signature specific to the deposition, which is thus transparent in the visible range.

Application of an after-treatment to the sample deposited on glass:

The glass sample is placed in the after-treatment reactor and, in this case, only helium is introduced into the reactor.

The pressure is regulated to 26 Pa. The power applied to the cathode is 0.13 W.cm$^{-2}$ only. The frequency is maintained at 40 kHz.

Transmittance measurements on a glass sample coated with the sandwich SiO$_x$-silver nanoparticle-SiO$_x$ deposition have been made after a helium plasma after-treatment of a total duration of 30 seconds, 2 minutes, 5 minutes, and 10 minutes.

With the after-treatment, an absorption peak centered on a 420-450 nanometers wavelength range is detected. Such an absorption is characteristic of a surface plasmon resonance of silver nanoparticles in a SiO$_2$ matrix. The intensity of this absorption strip increases along with the duration of the He plasma after-treatment. The absorption control then is a function of the time of exposure to helium plasma.

With the after-treatment, an accumulation of silver particles is detected in cross-section observations on the silicon substrate (FIG. 4). The diffusion is stopped by the native silica, which behaves as a diffusion barrier layer.

Example 2

Figure 5:
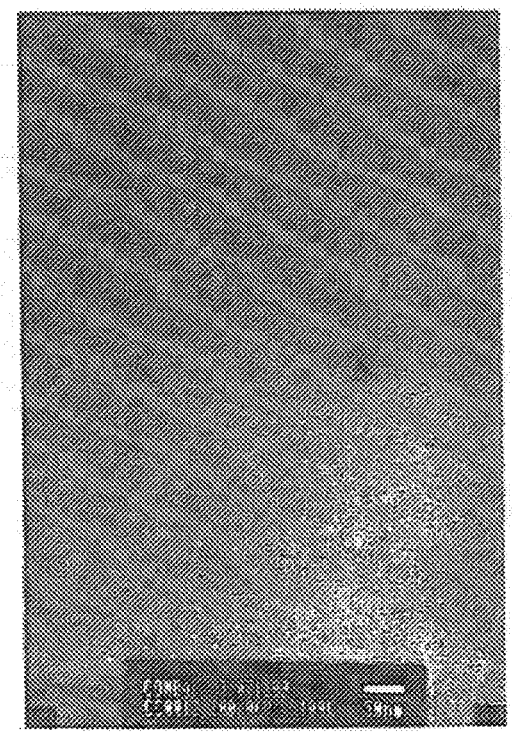
FIG. 5 illustrates a $SiO_x$—Ag—$SiO_x$ deposition on a TEM grid, with a smaller amount of silver than in example 1 of FIG. 2.
Figure 6:
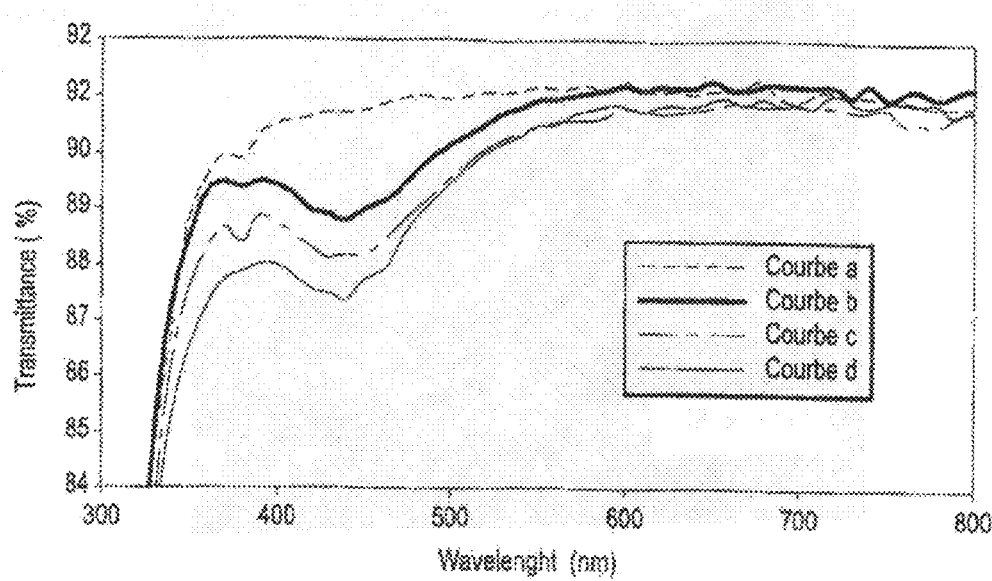
FIG. 6 shows the transmission-vs.-wavelength curves obtained for a glass substrate coated with a sandwich $SiO_x$—Ag—$SiO_x$ deposition (example 2) before and after the after-treatment with a He plasma; curve (a) illustrates the deposition before the after-treatment while curves (b) to (d) illustrate the deposition after an after-treatment of 30 seconds, 2 minutes, and 5 minutes, respectively.

This example is illustrated by FIGS. 5 and 6.

A SiO$_x$-silver nanoparticle-SiO$_x$ deposition is achieved in three steps on a soda-lime glass substrate and a TEM observation grid, with a smaller silver amount than in example 1.

The first and the third step are identical to those of example 1. The second step differs by the density of power injected on the silver target. In this example, it is 0.5 W.m$^{-2}$, that is, twice less than in example 1.

Characteristics of the obtained film:

As for example 1, the final deposition has a sandwich SiO$_x$-silver nanoparticle-SiO$_x$ structure. The TEM observation of the sandwich film on a copper TEM grid reveals the presence of silver nanoparticles having a diameter of approximately 1.5 nanometers. Such silver nanoparticles are approximately twice smaller than those obtained in example 1.

The transmittance of the film deposited on soda-lime glass is determined by an optical spectrometer measurement between 300 and 800 nanometers. Transmission curve (a) (FIG. 6) corresponds to the transmission of the glass sample such as deposited (before the after-treatment). It is similar to curve (a) of FIG. 3, which is itself almost identical to those of the plain glass substrate. The deposition is transparent in the visible range.

Application of an after-treatment to the sample deposited on glass:

As in example 1, the sample is placed in the PECVD reactor. Helium is introduced and the pressure is regulated to 26 Pa. The power applied to the cathode is 0.13 W.cm$^{-2}$. The frequency is maintained at 40 kHz.

Transmittance measurements on a glass sample coated with the SiO$_x$-silver nanoparticle-SiO$_x$ deposition have been made after a helium plasma after-treatment of a total duration of 30 seconds, 2 minutes, and 5 minutes. The transmittance curves are shown in FIG. 6.

With the after-treatment, an absorption peak centered on a 420-450 nanometers wavelength range is detected again. The intensity of the absorption is lower than in example 1, which is logical since there is less silver in this sample, the power density applied to the silver target being twice smaller than in example 1. However, the absorption also increases along with the time of exposure to the helium plasma and the sample coloring intensifies.

The second example shows once again the efficiency of the helium plasma after-treatment to control the surface plasmon resonance of metal nanoparticles, Example 3

Figure 7:
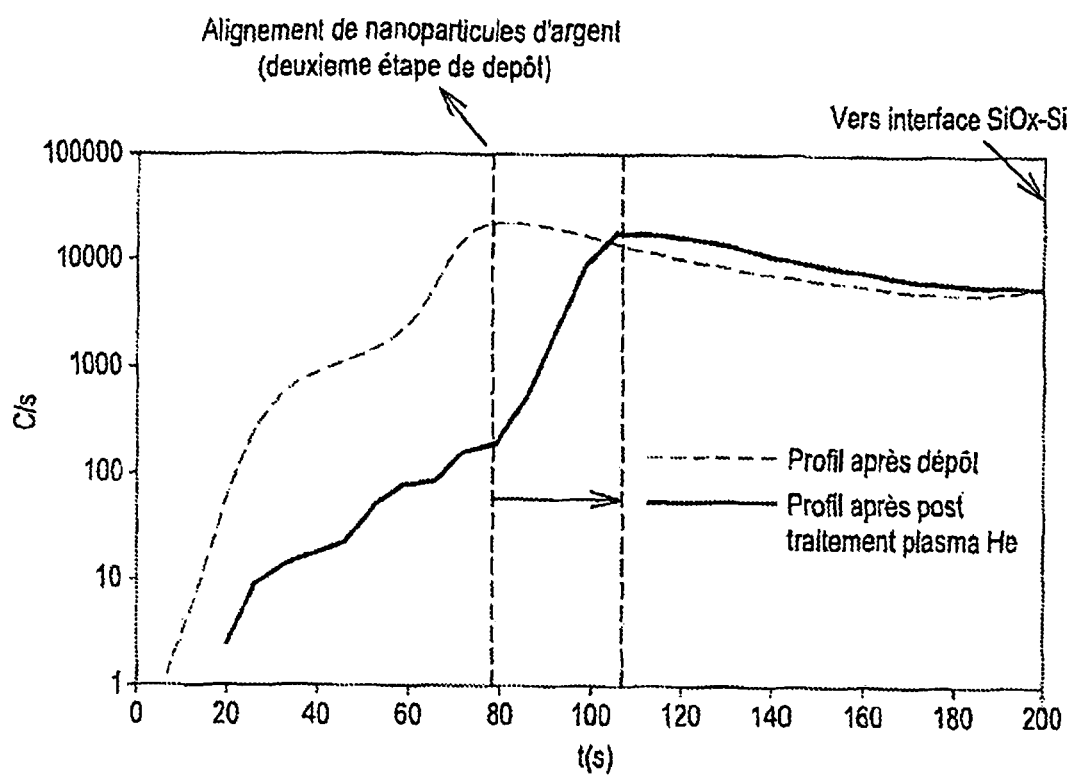
FIG. 7 shows the silver concentration profile along time.

This example is illustrated in FIG. 7,

A SiO$_x$—Ag—SiO$_x$ deposition is achieved in three steps on several silicon substrates.

Two silicon samples are coated in the same conditions as in example 1. On the first sample, a SIMS ("Secondary Ion Mass Spectrometry") silver profile is drawn just after the deposition. On the second sample, a helium plasma after-treatment of 10 minutes in conditions identical to those of examples 1 and 2 is applied, after which the SIMS silver profile is determined. The SIMS analysis conditions are identical to those of the first sample.

After deposition, silver particles are present in the two SiO$_x$ layers (first and this deposition steps). After the helium plasma after-treatment, this profile is modified. A diffusion of silver particles towards the silicon substrate clearly appears. The amount of silver particles is smaller than in the second SiO$_x$ layer which is at the external surface of the sample (third deposition step) and the maximum silver concentration is offset towards the substrate.

This results in an additional advantage of the present invention, which is the possibility of controlling the diffusion of silver particles towards the substrate, and thus of modulating the functional properties.

The invention claimed is:

1. A method for diffusing metal particles comprising a composite layer deposited on a substrate, said composite layer further comprising at least one dielectric matrix, wherein the diffusion of said metal particles towards said substrate is achieved by means of a plasma treatment.

2. The metal particle diffusion method of claim 1, wherein the plasma treatment is performed by means of a cold plasma.

3. The metal particle diffusion method of claim 1, wherein the plasma contains at least one gas selected from the group comprising helium, argon, xenon, and mixtures thereof.

4. The metal particle diffusion method of claim 1, wherein the metal particles are particles of a metal selected from the group comprising silver, copper, gold, titanium, chromium, tantalum, and mixtures thereof.

5. The metal particle diffusion method of claim 1, wherein said composite layer is prepared by simultaneous deposition of the metal particles and of the dielectric matrix.

6. The metal particle diffusion method of claim 1, wherein the dielectric matrix is a composite layer prepared by one of wet (impregnation, sol-gel) and dry (PVD, CVD) processes.

7. The metal particle diffusion method of claim 1, wherein the dielectric matrix is a dielectric oxide.

8. The metal particle diffusion method of claim 1, wherein the substrate is made of one of glass, silicon, and polymer.

9. The metal particle diffusion method of claim 1, wherein the plasma treatment is performed:
   in a PECVD reactor,
   with helium,
   with a frequency ranging between 0 and 2.45 GHz,
   for a time period ranging between 1 second and 60 minutes,
   with a power applied to the cathode ranging between 0.01 W/cm$^2$ and 10 W/cm$^2$, and
   at a temperature ranging between 15 and 45° C.

10. The metal particle diffusion method of claim 9, wherein the plasma treatment is performed with a frequency ranging between 10 kHz and 450 kHz.

11. The metal particle diffusion method of claim 9, wherein the plasma treatment is performed for a time period ranging between 15 seconds and 15 minutes.

12. The metal particle diffusion method of claim 9, wherein the plasma treatment is performed with a power applied to the cathode ranging between 0.01 W/cm$^2$ and 1 W/cm$^2$.

13. The metal particle diffusion method of claim 1, wherein the plasma treatment is performed by means of a cold plasma at ambient temperature.

14. The metal particle diffusion method of claim 1, wherein said composite layer is prepared by sequential depositions of at least one dielectric matrix and of the metal particles.

15. The particle diffusion method of claim 1, wherein the dielectric matrix is a composite layer prepared by PVD.

16. The metal particle diffusion method of claim 1, wherein the dielectric matrix is silicon oxide (SiO$_x$).

* * * * *